United States Patent [19]

Singh

[11] Patent Number: 5,093,805
[45] Date of Patent: Mar. 3, 1992

[54] NON-BINARY MEMORY ARRAY

[75] Inventor: Gurdev Singh, Gilroy, Calif.

[73] Assignee: Cypress Semiconductor Corporation, San Jose, Calif.

[21] Appl. No.: 541,122

[22] Filed: Jun. 20, 1990

[51] Int. Cl.$^5$ .......................... G11C 5/02; G11C 5/06
[52] U.S. Cl. ................... 365/51; 365/189.01; 365/189.02; 365/221; 365/230.01
[58] Field of Search ............... 365/51, 200, 189.01, 365/230.01, 230.06, 221, 73, 78, 239

[56] References Cited

U.S. PATENT DOCUMENTS

| | | | |
|---|---|---|---|
| 4,047,163 | 9/1977 | Choate et al. | 365/200 X |
| 4,653,050 | 3/1987 | Vaillancourt | 365/200 X |
| 4,791,607 | 12/1988 | Igarashi et al. | 365/51 |
| 4,945,513 | 7/1990 | Ueda | 365/51 |

OTHER PUBLICATIONS

"CMOS BiCMOS Data Book," Cypress Semiconductor, Feb. 1, 1989, pp. 5-48-5-59.

*Primary Examiner*—Alyssa H. Bowler
*Attorney, Agent, or Firm*—Blakely, Sokoloff, Taylor & Zafman

[57] ABSTRACT

An integrated circuit device having a memory array of memory cells in which the total number N of unique available memory addresses is a power of two, yet wherein neither the number of columns nor the number of rows of cells is a power of two. This permits the chip die size and height/width ratio to be optimized. The device further includes a circuitry for generating address selection signals, providing a total number of unique addresses equal to N, leaving unused some of the memory cells comprising the array.

13 Claims, 3 Drawing Sheets

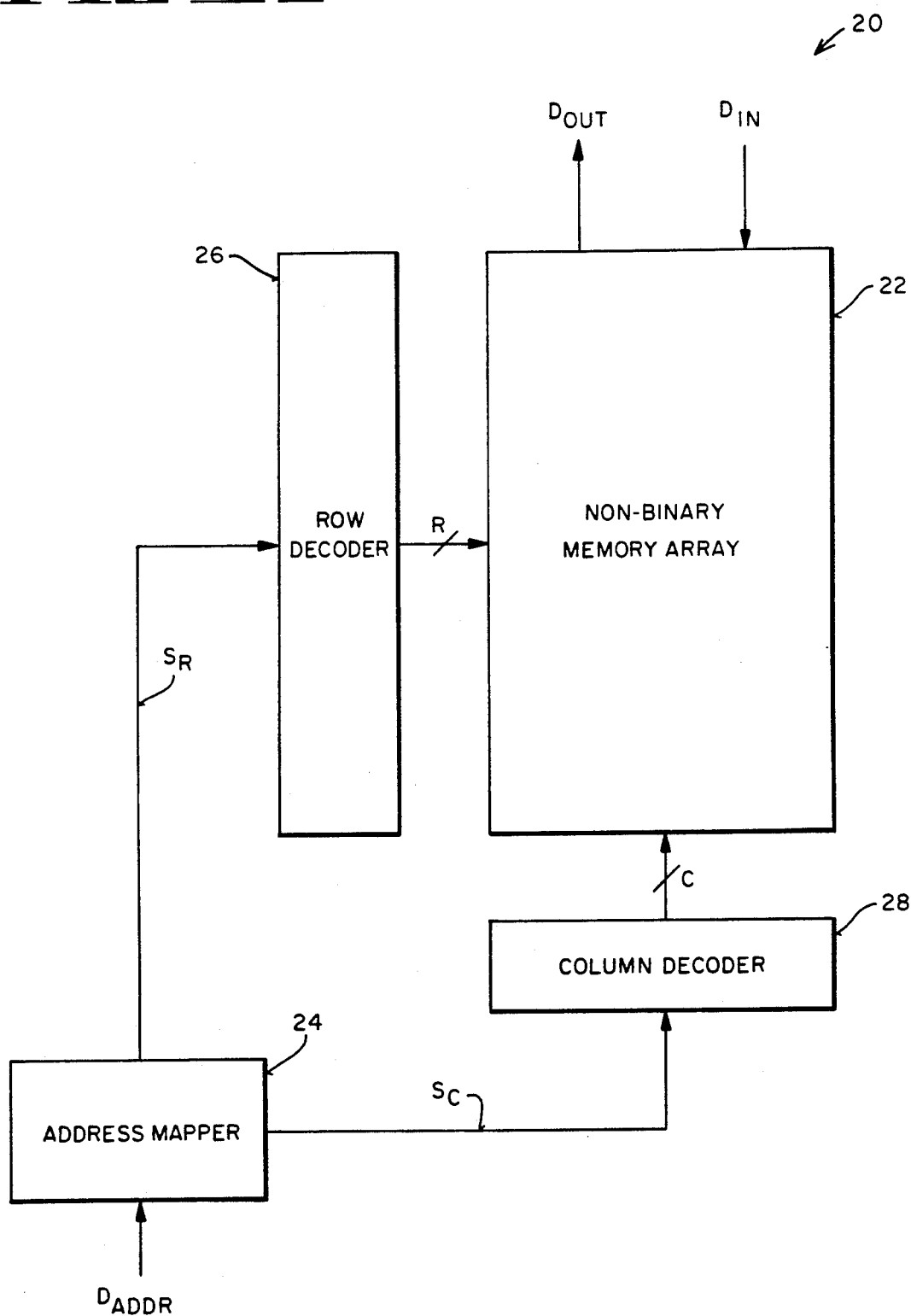

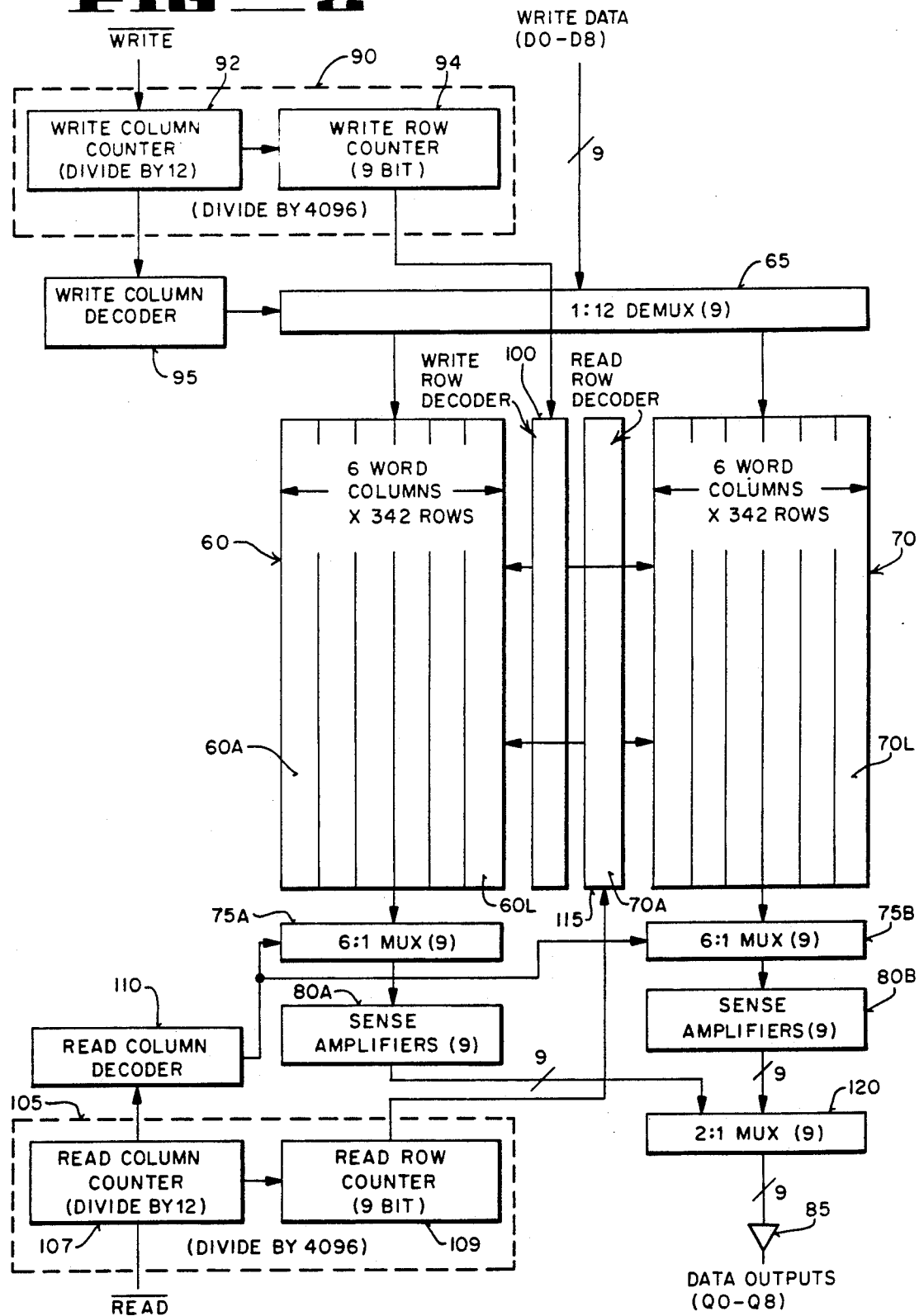

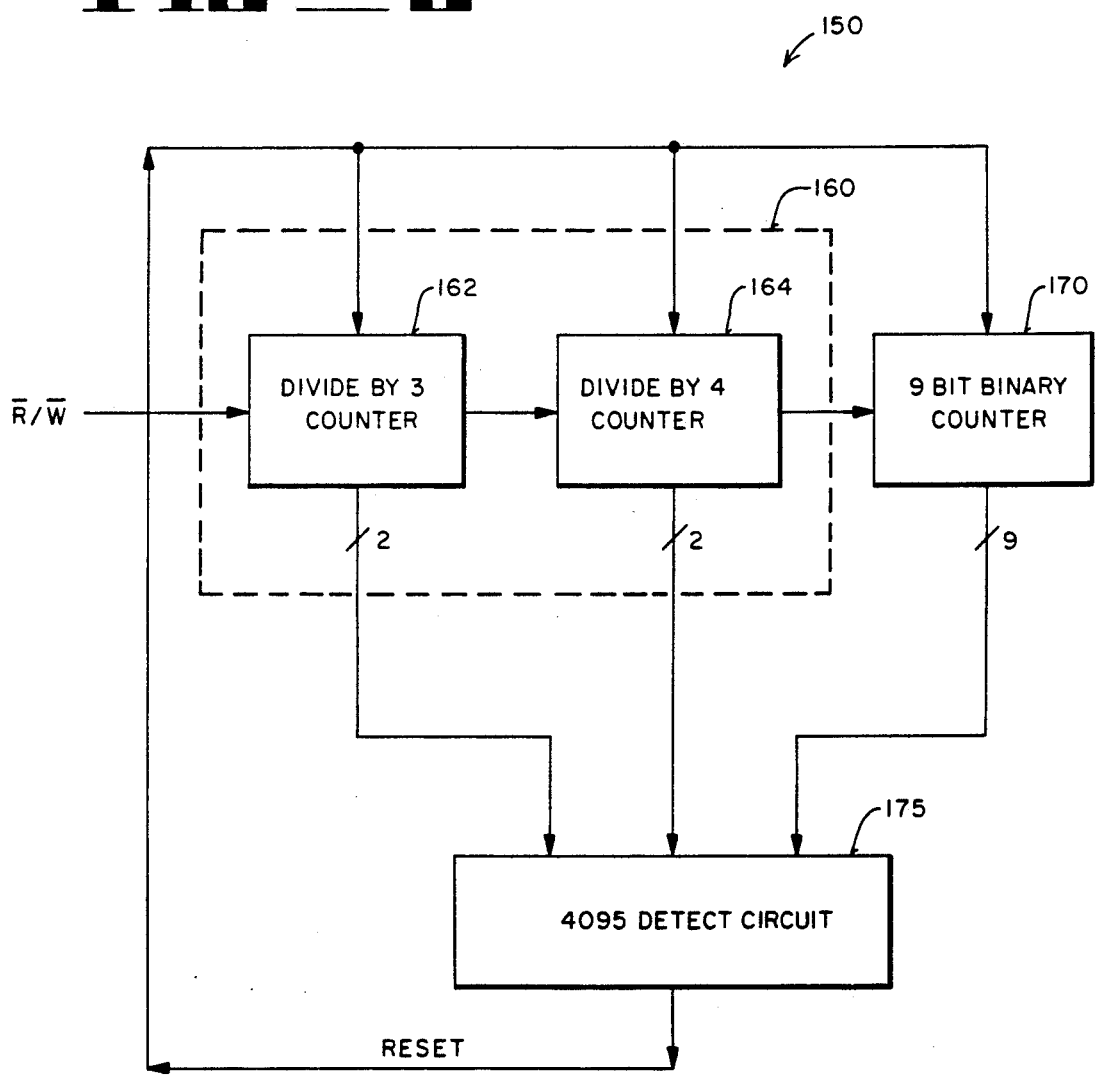
FIG_3

NON-BINARY MEMORY ARRAY

BACKGROUND OF THE INVENTION

The present invention relates to integrated semiconductor memory devices, and more particularly to an improved memory core configuration for such memories which permits the number of bits of a memory array to be increased by increasing the number of columns or rows by any amount.

Semiconductor memory devices are well known in the art, and typically comprise a memory array or core comprising a multitude of data storage elements arranged in rows and columns of the memory array. Conventionally, the number of columns of a memory array is increased only by doubling the previous number of columns. This conventional scheme permits the use of binary counters to generate internal sequential addresses. Under this constraint the width of the memory device die cannot be matched to the maximum die size for a package. If the die height/width ratio is unacceptable, only a wider package could be used.

It is accordingly an object of the invention to provide a memory array wherein the number of bits of a memory array can be increased by increasing the number of columns or rows by any arbitrary amount.

A further object of the invention is to provide a memory array in a semiconductor chip die, wherein the number of columns can be increased in increments of the word size, and the height/width ratio of the die can be optimized.

SUMMARY OF THE INVENTION

An integrated circuit device is provided having a memory array of memory cells arranged in rows and columns, wherein the number N of addressable cell word locations is a power of two, and a means for generating internal addresses to select particular array word locations. The memory device is characterized in that the array is defined by a number of rows R and a number of columns C of memory cells, wherein neither R nor C is required to be a power of two.

In one preferred embodiment, the memory array device is a randomly accessible memory (RAM), and the means for generating the internal addresses includes a means for mapping external address selection signals into a corresponding set of row and column selection signals.

In a second exemplary embodiment, the memory device is a first-in-first-out memory buffer device, and separate read and write address counters are provided, the former incremented by the read control signal and the latter incremented by the write control signal. Asynchronous read and write sequential addresses are generated by the respective read and write address counters.

In this embodiment the means for generating internal addresses comprises an address counter having a total number of count states equal to N, the number of addressable cell locations. The address counter includes a column counter whose state determines the unique column address of the word location to be addressed. The column counter has a total number of possible unique states equal to the number of unique column addresses C, and generates a terminal count signal when the counter state reaches the maximum count state.

The address counter further includes a row counter clocked by the column counter terminal count signal and having a maximum number of unique count states at least equalling the number of unique row addresses. The state of the row counter determines the unique row address.

The means for generating the internal addresses further includes a means responsive to the column and row counter states for detecting when the internal address has been clocked N times, i.e., when the N unique array addresses have been sequentially generated. At this point, the detector means generates an address reset signal which resets the column and row counter states to zero.

The invention has broad application in any type of integrated circuit memory device with a memory array core. The invention releases the device designer from the constraint that the number of rows and columns be a binary number (i.e., a number which is a power of two), and permits the array physical configuration and height/width ratio to be optimized for a particular application.

BRIEF DESCRIPTION OF THE DRAWINGS

These and other features and advantages of the present invention will become more apparent from the following detailed description of an exemplary embodiment thereof, as illustrated in the drawings, in which:

FIG. 1 is a simplified schematic block diagram of a RAM circuit embodying the invention.

FIG. 2 is a schematic block diagram illustrating the functional block diagram of a first-in-first-out memory buffer device in accordance with the invention.

FIG. 3 is a simplified schematic diagram showing the divide-by-N counter which may be used to generate internal sequential addresses for the memory device of FIG. 2.

DETAILED DESCRIPTION OF THE PREFERRED EMBODIMENT

The invention in a general form comprises an integrated circuit device characterized by a non-binary memory array and a means for generating internal array addresses to select particular array addresses to which data is to be written or from which data is to be read, and wherein the number of allowable memory addresses is a binary number.

As used herein, a "binary" array is one which has a total number of uniquely addressable memory locations which is an integral power of two; a "binary" number is one which is an integral power of two.

A first embodiment of an integrated circuit device embodying the invention is shown in the simplified schematic block diagram of FIG. 1. The device 20 in this case comprises a randomly accessible non-binary memory array 22. The array 22 comprises a plurality of memory cells, e.g., EPROM or EEPROM cells, arranged in R addressable rows and C columns. Both R and C are non-binary numbers.

Data $D_{in}$ may be written into selected memory cell locations in the array 22. Data $D_{out}$ may be read from selected memory cell locations in the array 22. Circuitry for writing data to a particular cell location and reading data from a cell location (i.e., reading the cell state) is well known in the semiconductor memory arts.

The device 20 further includes a means for generating internal array addresses to select the particular memory locations for the read and/or write operations. In this embodiment, the address generating means comprises an address mapper 24 which is responsive to the address data $D_{addr}$. The mapper 24 maps the address data $D_{addr}$ into decoder control signals $S_r$ and $S_c$ for controlling the respective row decoder 26 and column decoder 28. The address mapper 24 essentially converts the binary address data $D_{addr}$, which may in a particular example be a 12 bit word defining 1 of the possible N addressable memory locations in the array, e.g., N=4096 in one exemplary embodiment, into particular row and column addresses. The mapper 24 could take the form of a look-up table, by way of example. The row decoder 26 in response to the signal $S_r$ generates a row select word of R bits to select one of the R rows in the array 22. The column decoder 28 in response to the signal $S_c$ generates a column select word of C bits to select one of the C columns in the array 22.

While the array 22 has a non-binary number of memory locations, only a binary number of these memory locations are used, i.e. are uniquely addressable by the address mapper 24. Thus the RAM circuit 20 provides the function of a binary RAM circuit from a non-binary memory array.

The RAM memory array device 20 of FIG. 1 may be employed as a separate RAM chip, or form part of the circuitry of a more complex device such as a microcomputer or digital signal processor device formed on a single chip.

To explain the invention and its advantages in more detail, a particular embodiment of an integrated circuit memory device will be described. The invention has been used to expand the capacity of a 2048 word-by-9-bit-wide, first-in-first-out (FIFO) memory to a 4096 word-by-9-bit-wide FIFO memory device. Assume that a requirement is to fit the 4K×9 FIFO in a standard 300 mil width package, restricting the die width to 140 mils. The memory array of the 2K×9 FIFO has 8 columns of 9 bit words arranged in 256 rows. The conventional method to expand the 2K×9 FIFO to 4K×9 size would require that either the number of columns or the number of rows of the 2K×9 FIFO be doubled. However, doubling the number of rows would make the die height/width ratio unacceptable. Thus, only the number of columns could be doubled. However, doubling the number of columns would exceed the maximum die width of 140 mils. The invention permits increasing the number of columns from 8 to 12 columns of 9 bit words. The memory array of the 4K×9 FIFO is constructed using 12 columns and 342 rows, with 8 unused word addresses. Thus, a 4096 word-by-9 bit memory device has been provided which employs a memory array in which neither the number of columns nor the number of rows need be a power of 2, i.e., the array is non-binary.

The non-binary array employs a new addressing scheme. The conventional addressing scheme used binary counters to generate internal sequential addresses. The new scheme counts the column addresses (0-11) first, followed by incrementing the row address. When the combined column and row count reaches 4095, i.e., after 4096 counts, the address is set to zero, and the count commences again.

FIG. 2 is a simplified block diagram of an integrated circuit FIFO memory device 50 employing the invention. In this exemplary embodiment, the device 50 includes a memory core array divided into half cores 60 and 70, each comprising L word columns (or columnar groups) of memory cells 60A–60L and 70A–70L. Each columnar group of memory cells in turn comprises 9 bit columns of memory cells in this embodiment. Thus, the cells in a given row and a given columnar group can store a single data word of 9 bits in length in this example.

The FIFO memory device 50 is organized such that data is read in the same sequential order that is written. The memory cells used in the device 50 are dual port RAM cells, which enable the read and write operations to be independent of each other and permit asynchronous operation of the inputs and outputs. The time required to increment the read and write address counters is less than the time that would be required for data to propagate through the memory, which would be the case if the memory were implemented using conventional register array architectures. Such dual port RAM architecture has been used in prior FIFO buffer devices marketed by the assignee of this invention as CY7C420, CY7C421, CY7C424, CY7C425, CYC428 and CY7C429 FIFO buffer memory devices, as described more fully in the "CMOS BiCMOS Data Book," Cypress Semiconductor Corporation, Feb. 1, 1989, at pages 5–48 to 5–59, which are incorporated herein by this reference.

In this exemplary device, the number of columnar groups is selected to be 12, a number which is not a power of two. The memory cells of the array are further arranged in rows, in this case 342 rows, a row number which also is not a power of two.

Write data words comprising bits D0–D8 are written into the array via a 1:12 demultiplexer 65 which selects the particular columnar group to which the data word is to be written in accordance with the write column decoder 95. The particular row to which a particular write data word is to be written is selected by the write row decoder 100.

The respective write decoders 95 and 100 are controlled by the count states of the write divide-by-4096 counter 90. The counter 90 is clocked by the write signal $\overline{WRITE}$. The four least significant bits of the counter 90 state comprise a write column counter 92 which operates as a divide-by-12 counter unit, whose count state controls the decoder 95 and generates a terminal count signal when the maximum count state is reached. This terminal count signal increments the write row counter unit 94, a 9-bit binary counter unit. Thus, for a particular row, data will be sequentially written into successive columnar groups comprising the row of memory cells, with the rows being in turn sequentially selected. Once the count state of counter 90 reaches 4095, the total number of memory cells being utilized in the device 50 minus one (since the initial count state is zero), the count state is reset, and the write sequence commences again by writing data into the first columnar group of the first row.

The particular columnar group and row from which data is to be read from the device 50 is selected by the read column decoder 110 and the read row decoder 115. These decoders are controlled by the read divide-by-4096 counter 105. The operation of this counter 105 is similar to that of counter 90, except that the counter 105 is clocked by the read signal $\overline{READ}$. Thus, the counter 105 includes a read column counter 107 and a read row counter 109, whose respective count states control the column and row decoders 110 and 115.

The column read logic for the device 50 includes 6:1 multiplexers 75A and 75B to select a single one of the columnar groups of each of the half array cores 60 and 70. The columns of the selected columnar groups from the half array cores 60 and 70 are coupled to sense amplifiers 80A and 80B to read the states of the selected memory cells in the selected row. The sense amplifier 80A and 80B outputs are connected to the output multiplexer 120 to select the columnar outputs from either half-array 60 or half-array 70 as to the data outputs. The multiplexer 120 outputs are connected to respective tri-state buffers 85 (there are nine buffers 85 in this embodiment). The buffer 85 outputs provide the data outputs Q0-Q8. The multiplexers 75A and 75B, the sense amplifiers 80A-80B, the multiplexer 120, and the tri-state buffers 85 are circuit elements well known in the semiconductor memory art.

FIG. 3 is a simplified block diagram of a divide-by-4096 counter 150 which may be employed as the counters 90 and 105. The counter 150 comprises a column counter 160 whose state controls the column (read or write) decoder. The counter 160 in this embodiment comprises a divide-by-three circuit 162 whose terminal count output in turn increments a divide-by-four counter 164. The divide-by-three counter 162 is incremented or clocked by the read $\overline{R}$ or write $\overline{W}$ signal. The terminal count output of the divide-by-twelve counter 160 in turn increments a nine-bit binary counter 170. The binary counter 170 state controls the row (read or write) decoder. The count states of the respective counters 162, 164 and 170 are sensed by a 4095 state detector 175. When the value of the count of counter 150 reaches 4095, the detector 175 detects this condition and resets each counter 162, 164 and 170 to zero. The count of counter 150 then starts anew from zero.

The counter 150 therefore generates internal sequential addresses to select a particular array word location. The counter 150 comprises a column counter having a number of count states which equals the number of columns to be uniquely addressed. The count state of the column counter controls the column decoders. When the column counter has reached its maximum state, it generates a signal which increments the row counter 170, and the state of the column counter is set to zero. The row counter 170 is a binary-sized counter whose number of unique count states equals or exceeds the number of uniquely addressable array rows.

The memory device 50 is constructed with 12 columnar array groups, and 342 cell rows, providing a total of 4104 memory word locations, of which 4096 are used and 8 are unused. Therefore, a non-binary structured array core has been used to provide a binary memory array. Such a non-binary structured array, wherein the number of rows and the number of columns are arbitrary values which need not be powers of two, provides significant improvements in optimizing the chip die size for a particular array core size. This improvement results directly from releasing the device designer from the constraint of using arrays in which the numbers of rows and columns are powers of two.

It is understood that the above-described embodiments are merely illustrative of the possible specific embodiments which may represent principles of the present invention. Other arrangements may readily be devised in accordance with these principles by those skilled in the art without departing from the scope of the invention.

What is claimed is:

1. In an integrated semiconductor circuit device fabricated on a semiconductor chip die, an addressable memory array circuit characterized by N uniquely addressable address locations, wherein N is an integral power of two, comprising:

a two-dimensional memory array comprising a primary plurality of memory cells arranged in R rows and C columns, and wherein, exclusive of any redundant rows or columns of cells used to replace defective cells of said primary plurality of memory cells, neither R nor C is an integral power of two, wherein the number of memory cells of said primary plurality of memory cells comprising said array is not an integral power of two; and means for generating internal array addressing signals to select a unique address location for a cell or group of cells comprising said array, said means providing the capability of selecting only a number N of said cells or groups of cells comprising the array, thereby permitting the height/width ratio of the die to be optimized.

2. The circuit of claim 1 wherein said circuit is a randomly accessible memory (RAM) circuit responsive to memory address selection signals, and said means for generating addressing signals comprises a means for mapping said memory address selection signals into address signals which select the particular row and column at which the desired address location is located.

3. The circuit of claim 2 wherein said circuit further comprises means for reading data from a memory cell or group of cells in accordance with the address location determined by said memory address selection signal.

4. The circuit of claim 1 wherein said circuit comprises a first-in-first-out memory buffer circuit, and said means for generating internal array addressing signals comprises a first means for generating internal sequential write address signals, and second means for generating internal sequential read address signals.

5. An integrated circuit device having a memory array of memory cells arranged in rows and columns, wherein the number of available cell word locations N is a power of two, and a means for generating internal sequential addresses, further characterized in that:

said array is defined by a number of rows R and a number of columns C of memory cells, wherein neither R nor C is a power of two; and said means for generating internal sequential addresses comprises an array address counter having a total number of different unique count states equal to N, said array address counter comprising:

a column counter whose state determines the unique column address, said column counter having a total number of possible unique states equal to the number of unique column addresses C, said column counter generating a column signal when the counter state reaches the maximum count state;

a row counter incremented by said column counter signal and having a maximum number of unique count states at least equalling the number of unique row addresses R, the state of said row counter determining the unique row address; and means responsive to the column and row counter states for detecting when the internal address has been incremented N times and generating an array address reset signal which resets the column and row counter states to zero.

6. The integrated circuit device of claim 5 wherein data words are loaded into said memory array under control of a write control signal, said array address counter being responsive to said write control signal to increment the state of said column counter.

7. The integrated circuit device of claim 5 wherein data words are read from said memory array under control of a read control signal, said array address counter being responsive to said read control signal to increment the state of the column counter.

8. The integrated circuit device of claim 5 wherein said array address counter has sequential count states from zero to (N−1), and wherein said detecting means comprises means for detecting when the array address count state reaches the value (N−1).

9. The integrated circuit device of claim 5 wherein said row counter comprises a binary counter circuit.

10. An integrated first-in-first-out (FIFO) memory circuit device having a memory array of memory cells arranged in rows and columns, wherein the number of available cell word locations N is a power of two, and a means for generating internal write sequential addresses, further characterized in that:
   said array is defined by a number of rows R and a number of columns C of memory cells, wherein neither R nor C is a power of two, and wherein the total number of unique array addresses N employed by the device is a power of two;
   said means for generating internal write sequential addresses comprises a write address counter having a total number of different unique count states equal to N, said address write counter comprising:
   a write column counter whose state determines the unique write column address, said column counter having a total number of possible unique states equal to the number of unique column addresses C, said write column counter generating a write column signal when the counter state reaches the maximum count state;
   a write row counter incremented by said write column signal and having a maximum number of unique count states at least equalling the number of unique row addresses R, the state of said write row counter determining the unique write row address; and
   means responsive to the column and row counter states for detecting when the internal write address has been incremented N times and generating a write a rest signal which resets the write column and row counter states to zero; and said mean for generating internal read sequential addresses comprises a read address counter having a total number of different unique count states equal to N, said read counter comprising:
   a read column counter whose state determines the unique read column address, said column counter having a total number of unique column addresses C, said read column counter generating a read column signal when the counter state reaches the maximum count state;
   a read row counter incremented by the read column signal and having a maximum number of unique count states at least equaling the number of unique row addresses R, the state of said read row counter determining the unique read row address; and
   means responsive to the read column and row counter states for detecting when the internal write address has been incremented N times, and generating a read reset signal which resets the read column and row counter states to zero.

11. The FIFO memory device of claim 10 wherein said write row counter comprises a binary counter circuit.

12. The FIFO memory device of claim 10 wherein said read row counter comprises a binary counter circuit.

13. In an integrated semiconductor circuit device comprising a first-in, first-out memory buffer circuit, an addressable memory array circuit characterized by N uniquely addressable address locations, wherein N is an integral power of two, comprising:
   a memory array comprising a plurality of memory cells arranged in R rows and C columns, wherein neither R nor C is an integral power of two, wherein the number of memory cells of the array is not an integral power of two; and
   means for generating internal array addressing signals to select a unique address location for a cell or group of cells comprising said array, said means providing the capability of selecting only a number N of said cells or groups of cells comprising the array, and wherein said means comprises a first means for generating internal sequential write address signals, and second means for generating internal sequential read address signals.

* * * * *